United States Patent [19]

Sprogis et al.

[11] Patent Number: 5,276,641
[45] Date of Patent: Jan. 4, 1994

[54] HYBRID OPEN FOLDED SENSE AMPLIFIER ARCHITECTURE FOR A MEMORY DEVICE

[75] Inventors: Edmund J. Sprogis, Underhill; Hing Wong, Jericho, both of Vt.

[73] Assignee: International Business Machines Corporation, Armonk, N.Y.

[21] Appl. No.: 806,027

[22] Filed: Dec. 12, 1991

[51] Int. Cl.$^5$ .............................................. G11C 13/00
[52] U.S. Cl. .................. 365/189.02; 365/207
[58] Field of Search .................. 365/189.02, 207, 208

[56] References Cited

U.S. PATENT DOCUMENTS

| | | | |
|---|---|---|---|
| 4,586,171 | 4/1986 | Fujishima | 365/207 |
| 4,700,328 | 10/1987 | Burghard | 365/51 |
| 4,733,374 | 3/1988 | Furuyama et al. | 365/205 |
| 4,916,661 | 4/1990 | Nawaki et al. | 365/51 |

OTHER PUBLICATIONS

Saeki, T. et al, "A Study of Close Packed Folded Bit--Line Cell Array (CPF) and Three Phase Folded Bit--Line Array / Circuit (TPF) for DRAM's", Nikkei Micro Devices, May 1991.

*Primary Examiner*—Joseph A. Popek
*Assistant Examiner*—Christopher R. Glembocki
*Attorney, Agent, or Firm*—Heslin & Rothenberg

[57] ABSTRACT

A hybrid open/folded bit line sense amplifier arrangement and accompanying circuitry primarily for use on a ULSI DRAM memory chip to reduce the area needed for a memory cell and eliminate noise between bit lines. The circuitry includes two memory arrays containing a plurality of memory cells interconnected by a plurality of bit lines and word lines. In the preferred embodiment, the memory cells are accessible on every two out of three bit lines encountered by a word line. A set of open bit line sense amplifiers each with two connectors, one multiplexed to a number of bit lines in the first array and the other multiplexed to a number of bit lines in the second array is provided. Each memory array has a set of folded bit line sense amplifiers with two connectors each connector multiplexed to a number of bit lines in the array. The control circuitry with multiplexing ensures that the connectors of the sense amplifiers access only one bit lines at a time. The accessed by the connectors of each folded line sense amplifier are non-adjacent and simultaneously therewith, a connector of an open bit sense amplifier accesses a bit line between the bit lines accessed by the folded sense amplifier. In the preferred embodiment each connector of a sense amplifier is multiplexed to three bit lines. In a second version the connectors are multiplexed to two bit lines.

30 Claims, 4 Drawing Sheets fig. 1 fig. 2 fig. 3 fig. 4

HYBRID OPEN FOLDED SENSE AMPLIFIER ARCHITECTURE FOR A MEMORY DEVICE

TECHNICAL FIELD

The invention described herein relates in general to computer memory chips and more particularly to ultra large scale integrated, ULSI, memory chips and an efficient and economical method for configuring the circuitry of such a chip. The ultimate purpose of the invention is to maximize use of space on the chip, thus reducing surface area needed for implementation of the memory cells and the accompanying circuitry while at the same time reducing or limiting the number of steps necessary for the fabrication of the chip. It is also designed for the elimination of noise in the circuitry for error free operation of the memory chip.

DESCRIPTION OF THE PRIOR ART

Technological developments in the field of semiconductor fabrication, in particular the design and manufacture of memory chips has been driven by a number of factors. Among tne more important factors has been the need to manufacture chips with larger memory capacity in the same or smaller surface area. A number of factors and their control affect the ability to shrink the actual physical space for the memory device on the chip while increasing the amount of memory readily available and accessible.

Over the last 10 to 15 years the amount of memory that can be stored on a semiconductor chip of approximately the same surface area has increased from 1000 bits to over 16 mega bits. Each successive increase in memory capacity has seen old problems reappear that require new solutions and new problems encountered. Among the problems encountered as the capacity of a memory chip has reached and passed the 16 mega bit and 64 mega bit capacity and beyond is the need to compress the structures and circuitry into a smaller area.

The size of the actual individual memory cells, given current technology, has been generally limited to no smaller than an 8 lithographic square layout. A lithographic square is the minimum two dimensional surface size on which a functional individual structure can be fabricated on a chip given current lithographic technology and the frequency of the electromagnetic radiation used in the lithographic process. As the memory capacity of computer memory chips, in partrcular ULSI DRAMS, approaches and passes 256 mega bits there is a need to reduce the memory cell size to at least 6 lithographic squares. Two problems created by this need for reduction in size are a substantial increase of noise and the need to find a suitable architecture for cell and wiring layout.

In fabricating memory cells in current size ranges, the space taken by the conductor lines has become a significant factor in the amount of space necessary to fabricate a memory device. One of the primary difficulties up to this time has been the fact that methods for reducing the space needed for cell layout and known methods of doing this have generally conflicted with the methods of reducing noise in the circuitry. One of the more common approaches in fabricating large memory devices in recent technology has been the use of folded bit line sense amplifiers which have the advantage of common mode noise rejection when working in conjunction with a word line. However, most known feasible architectural layouts for a chip which use folded sense amplifiers, require at least 8 lithographic squares for each memory cell. One reason for this is that the cell and word line layout typically involves the use of "passing word lines". A passing word line is a word line which passes under a bit line, but has no functional relationship with that cell. The passing word line, of course, takes up precious space, thus increasing the space consumed on a per cell basis. On the other hand, it is well known in the industry that an open bit line sense amplifier architecture can be easily implemented to allow the construction of memory cells of no more than 6 lithographic squares since there is no need to have a passing word line. However, the open sense line amplifier architecture has noise problems which make it undesirable.

A number of different ideas have been proposed and tried with the object of solving these problems. These attempts have included: Crossing the bit lines over each other periodically to provide for noise cancellation, running the bit lines and word lines at oblique angles to each other to stagger and separate the memory cells accessed. Interleaving folded bit lines to achieve noise cancellation.

Although all or these techniques have to some extent reduced noise in the circuits, the advantage obtained through their implementation has been more than offset by increased complexity in the fabrication and manufacture of the chip and the circuitry to implement them. Often, for example, bit lines or word lines must be disposed on extra metal layers. Many such techniques have only resulted in negligible gains in reduction of noise and little or no reduction in the space necessary for the placement of the memory cells and circuits on the chip.

DISCLOSURE OF THE INVENTION

Accordingly, the principle objects of this invention are to create a circuitry for a memory chip which allows for the fabrication of memory cells no larger than six lithographic squares and which substantially reduces the noise in the circuitry of ULSI memory chips, in particular a ULSI dynamic random access memory. The effect of the invention is to allow a high density chip to operate free of errors which are caused by excess noise while obtaining the advantage of reduced size. The circuitry has the added advantage of providing for common mode noise rejection and eliminating intercapacitive noise between adjacent circuits on a chip, primarily between bit lines, as well as intracapacitive noise between bit lines accessed by the same sense amplifier.

It is a further object of this invention to provide a memory device having a greater number of memory cells per unit area without experiencing any increase in noise problems and without requiring any extra metal layers.

Briefly, most memory chips are made up of arrays of memory cells. The memory cells are devices which can store a bit of binary information. There are a number of ways the cells can be implemented such as through a flip-flop circuitry or if limitation of space is a primary consideration, a dynamic memory cell consisting of a controlling transistor and a storage capacitor. These memory cells are interconnected by bit lines and word lines which, when activated by column and row decoders, allow the input of information into the cell or the reading of information from the cell. Most such devices require circuit elements to sense the logic state of the memory cell and to amplify that information for transfer to bit switches and ultimate output to the data buses or in the reverse operation, inputting data for storage in the memory cell. The sense amplifier is the device which senses the logic state of the cell, amplifies the information provided and outputs it to the system or inputs information from the system to the cell.

The present invention's basic structure consists of two memory arrays, each with a plurality of memory cells. These memory arrays employ a special cell layout architecture in which each cell shares only one passing word line with an adjacent cell. The memory cells are interconnected by bit lines which, in the preferred embodiment, are parallel to each other and word lines which are perpendicular to the bit lines. Between the two memory arrays, arranged in a column, is a set of open sense amplifiers. Each open sense amplifier has a connector on either side for respectively accessing each of the two memory arrays. One of the connectors is multiplexed to preferably three adjacent bit lines of one array while the other connector is multiplexed to preferably three adjacent bit lines of the opposite array. On the outer side of each memory array at the opposite ends of the bit lines is a set of folded bit line sense amplifiers, each having two connectors which are multiplexed to preferably three adjacent bit lines in the array, one of the bit lines being common to each of these connectors. When data is to be input or output from the memory cells in an array, a word line is activated. In such a selected array, the connectors of each of the folded bit line sense amplifiers are connected by the multiplexing circuitry to one bit line in that array. The two bit lines to which they are connected are separated by an intervening bit line. Simultaneously, the connectors of an open bit line sense amplifier are activated, one being connected to a bit line in the selected array and the other being connected to a bit line in the unselected array, the later being surrounded on either side by bitlines clamped to AC ground, thus balancing the open sense amplifier capacitively and thereby greatly reducing noise.

As noted above, the preferred embodiment calls for multiplexing the connectors of each sense amplifier to three bit lines. One of the advantages, as will be explained in detail below, is the system only needs to access the bit lines through the folded sense amplifiers, it does not need to access the bit lines through the open sense amplifiers. This reduces space needed because devices and circuitry that would normally be needed have been eliminated, reducing space used. An alternative embodiment described below calls for multiplexing each connector to only two bit lines which, although it has advantages, it requires that the system also access the open sense amplifiers to obtain information from some of the memory cells.

BEST MODE OF CARRYING OUT THE INVENTION

The foregoing and other objects, features and advantages of the invention will be apparent from the following more particular description of the preferred embodiments of the invention as illustrated in the accompanying drawings.

The following description and drawings do not include a number of circuit elements and other details which are well known to those familiar with the art. These aspects have been eliminated to avoid obscuring the important features of the present invention.

Figure 1:
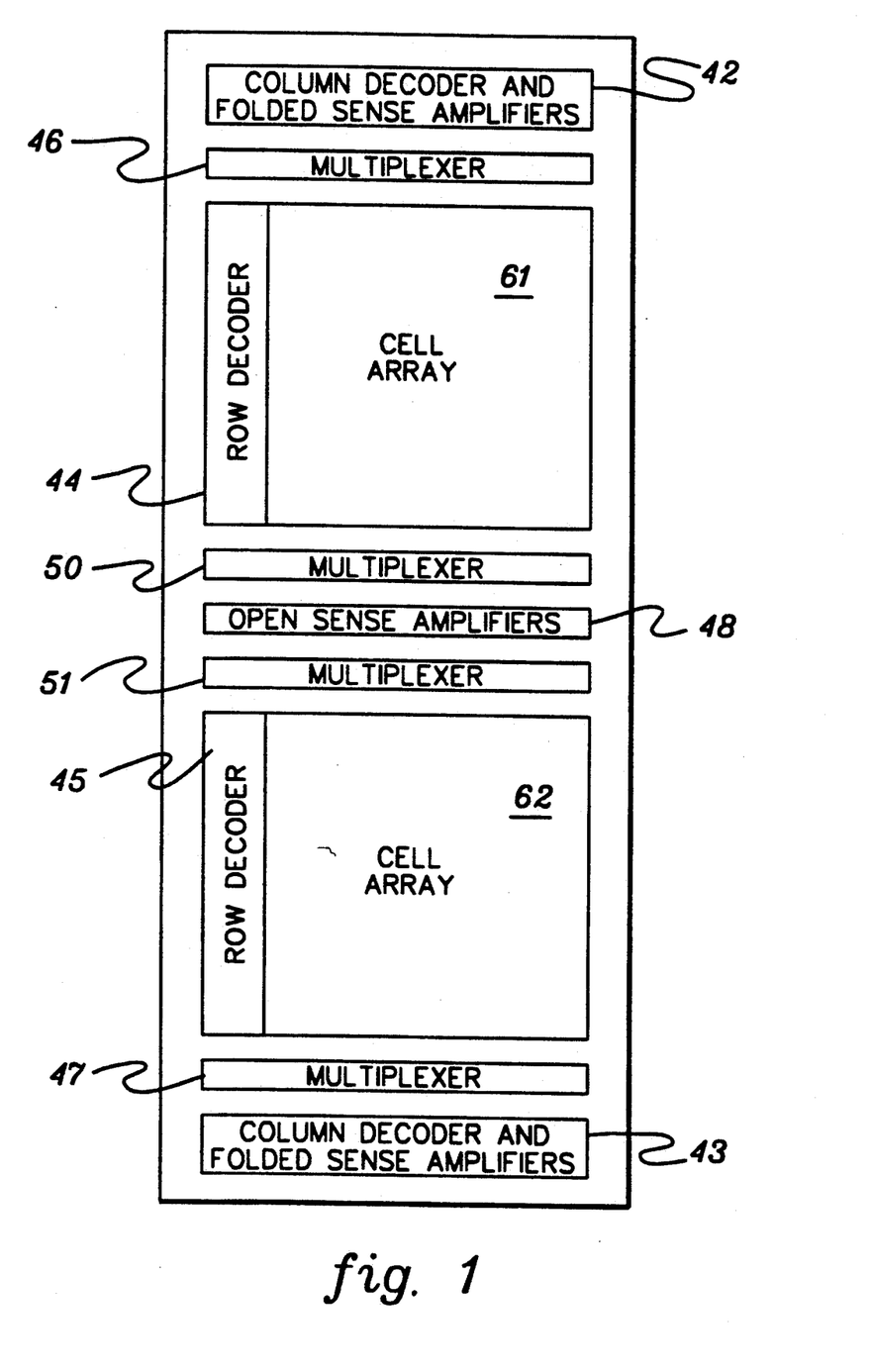
FIG. 1 is block diagram showing the general arrangement of a memory device made in accordance with this invention.

FIG. 1 shows the general arrangement of a memory device constructed in accordance with the teachings of this invention. The arrangement shown results from a hybrid combination of open and folded sense amplifiers arranged for accessing bit lines from opposite ends as will be explained hereinafter. Arrays 61 and 62 are preferably comprised of sets of memory cells of the conventional "one device" DRAM type (i.e. an FET having its gate coupled to a word line, its drain coupled to a bit line, and its source coupled to the storage capacitor, wherein a sense amplifier coupled to the bit line compares the voltage from the capacitor to a reference voltage to determine the stored logic state), as generally described in U.S. Pat. No. 3,387,286 issued Jun. 1968 to Dennard and assigned to IBM.

The cells contained within arrays 61 and 62, however, are laid out and interconnected to word lines and bit lines in a special way, to be explained below.

Located between arrays 61 and 62 is a series of open sense amplifiers 48 which are multiplexed through multiplexing circuits 50 and 51 to arrays 61 and 62 respectively. Located on the outer sides of arrays 61 and 62 are column decoders and folded sense amplifiers 42 and 43. The folded sense amplifiers contained within blocks 42 and 43 are also multiplexed to the bit lines contained in arrays 61 and 62 respectively through multiplexing circuits 46 and 47. The word lines contained within arrays 61 and 62 are controlled through row decoders 44 and 45 respectively.

Figure 2:
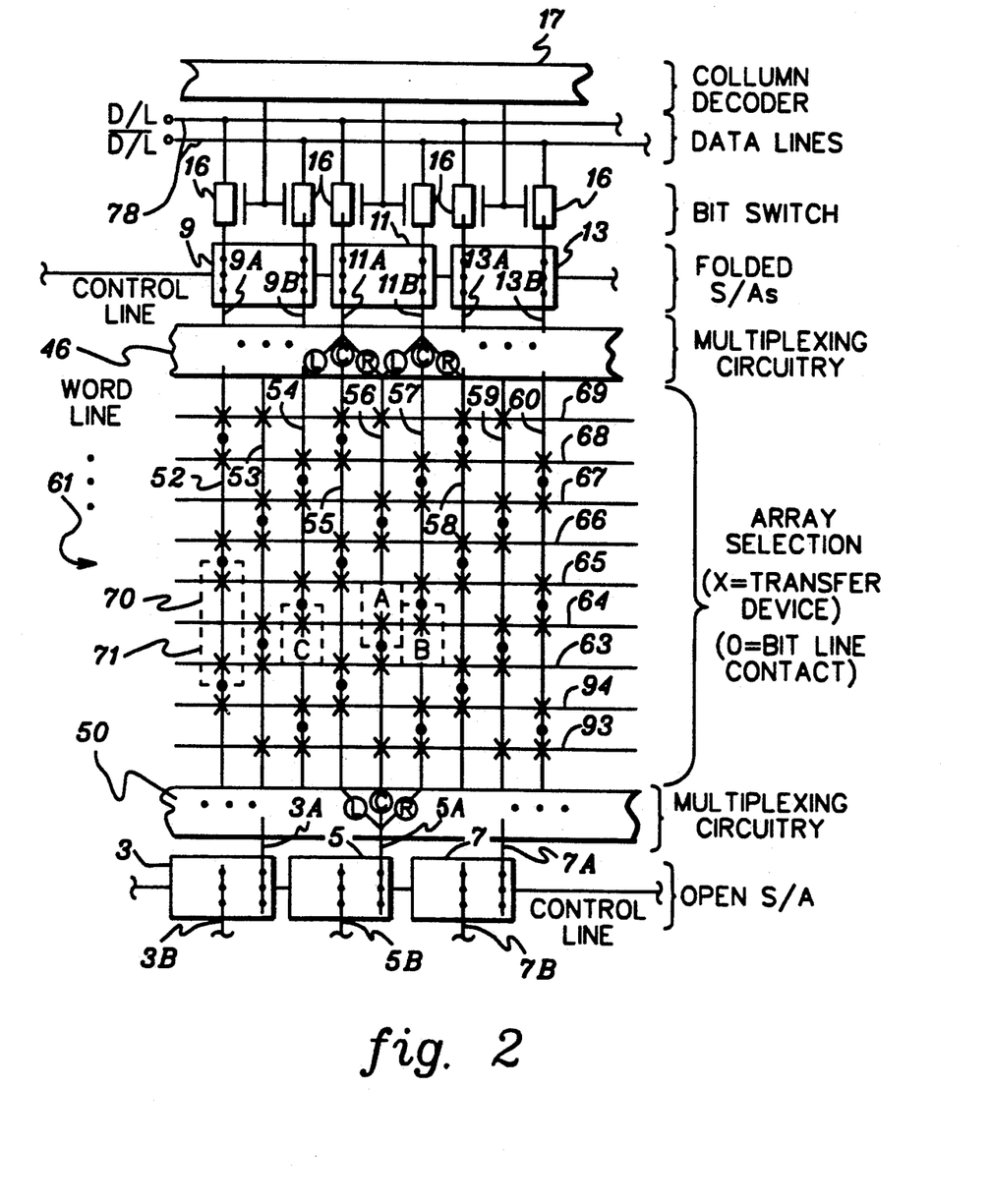
FIG. 2 is schematic diagram showing one of the cell arrays and its associated control circuitry as configured in the preferred embodiment of this invention.

FIG. 2 illustrates in greater detail the layout of the cells contained in array 61 and the control circuitry associated therewith. It should be understood that cell array 62 (FIG. 1) and its associated control circuitry can be mirror images of that shown in FIG. 2. Still referring to FIG. 2, it will be seen that array 61 contains a series of bit lines 52 through 60, running vertically, and a series of word lines 93, 94 and 63 through 69 running horizontally. The "X's" in FIG. 2 denote the presence of a transistor gate and the dots indicate the presence of an electrical contact between a bit line and the source node of each adjacent transistor. Although not shown, it will be understood that the drain node of each transistor leads to one plate of a capacitor, the other plate thereof being connected to AC ground.

As noted above, a memory cell preferably consists of a capacitor controlled by a transistor and two such memory cells 70 and 71 are outlined by dashed lines in FIG. 2. It will be seen that word line 64 passes between cells 70 and 71, and that it contains no transistor relating to either of those cells. Accordingly, word line 64 is regarded as a "passing word line" with respect to those two cells. The same pattern appears with respect to all of the other cells contained in array 61. In other words, each pair of cells located between any two bit line contacts on the same bit line have only one passing word line between them. This, of course, is a departure from conventional cell array architecture in which pairs of cells between contacts on the same bit line are separated by two passing word lines. Since each pair of cells shares a single passing word line, the array architecture depicted in FIG. 2 is known as the "halt passing word line" type. As used herein, that term refers also to the layout of the cells shown in FIG. 2. This layout may be implemented using only six lithographic squares.

The above described cell array architecture results in a pattern of cell placement along each word line that repeats itself at every fourth bit line. For example, following along word line 68 one finds cells at bit lines 54 and 55, but none at 56. Similarly, there are cells at bit lines 57 and 58, but none at 59. Thus, when word line 68 is selected, one can think of bit lines 54 and 55 as cell bit lines and bit line 56 as a reference bit line. Similarly, when word line 68 is selected, bit lines 57 and 58 are cell lines and bit line 59 is a reference line. It can thus be seen that the pattern encountered along a selected word line is: cell bit line, cell bit line, reference bit line.

It is common knowledge in the industry that the two lines, the cell bit line and the reference bit line, are used in conjunction to drive or be driven by a sense amplifier. The sense amplifier, generally a cross-coupled device pair, is one of the simplest forms of a bistable multivibrator logic circuit; it being part of a larger category of bistable multivibrator logic circuits known as latches. To those familiar with the art, it is conceivable that other forms of the latch could be used in place of the sense amplifier.

Also shown in FIG. 2 are bit line sense amplifiers 9, 11 and 13, each having two connectors for inputting or outputting data along selected bit lines to or from a memory cell. Each connector is multiplexed to three bit lines. For example, connector 11A of folded sense amplifier 11 is multiplexed to bit lines 54, 55, and 56 and connector 11B is multiplexed to bit lines 56, 57 and 58. It will be understood that the connectors of the other folded bit line sense amplifiers 9 and 13 are similarly multiplexed, each to three bit lines. For example, connector 9B is multiplexed to bit lines 53, 54 and 55 and connector 13A is multiplexed to bit lines 57, 58 and 59. For the sake of simplicity, however, only the multiplexing for connectors 11A and 11B is illustrated. The multiplexing device in each instance is so configured that each connector can be connected to only one line at a time. In the preferred embodiment the connectors of each folded bit line sense amplifier share only one common bit line. In FIG. 2, for example, only bit line 56 is shared by connectors 1A and 1B.

Also shown in FIG. 2 are open bit line sense amplifiers 3, 5 and 7, each having a connector multiplexed to three bit lines in array 61 and another connector multiplexed into three bit lines in array 62 (not shown). For example, connector 5A is mulitiplexed to bit lines 55, 56 and 57. Again, although not illustrated, the connectors 3A and 3B are similarly multiplexed to three bit lines. Connector 3A, for example, is multiplexed to bit lines 52, 53 and 54, and connector 7A is multiplexed to bit lines 58, 59 and 60. The multiplexing connections for connectors 3A and 7A are not shown for the sake of simplicity.

Folded sense amplifiers 9, 11 and 13 and open sense amplifiers 3, 5 and 7 are controlled by control lines CL. Still referring to FIG. 2, address signals received by the column decoder 17 from an address unit (not shown) result in the selection of a particular amplifier, depending upon which memory cell is to be accessed. This is accomplished by activating the bit switches 16 for a particular amplifier.

In accordance with this invention, a particular folded sense amplifier is operated in conjunction with a corresponding open sense amplifier. For example, folded sense amplifier 11 is operated in conjunction with open sense amplifier 5. Also, according to this invention, multiplexer circuitry 46 is configured so that the couplings made by the connectors of all amplifiers are coordinated. Each connector is multiplexed to a line designated "C" which is centrally located with respect to itself as well as the adjacent line to the left and the adjacent line to the right, these lines being designated in FIG. 2 as "L" and "R" respectively. Multiplexing circuitry 46 and 50 is configured so that all connectors of all amplifiers become coupled simultaneously to an "L" line, a "C" line or an "R" line. For example, connectors 11A and 11B can be coupled to bit lines 54 and 56 respectively, while connector 5A would be coupled to bit line 55. Thus, there is always a middle bit line lying between the two bit lines to which the two connectors of a folded sense amplifier are coupled and this middle bit line is coupled to an open sense amplifier. Bit lines to which a connector of a folded sense amplifier are connected are called "outer". It should be noted with respect to the preferred embodiment described herein that all connections from array bit lines to sense amplifiers (IE multiplexing circuitry) are through only one pass device and are therefore balanced. Additionally, the selected pass devices could be operated in a resistive mode to assist in sensing amplification.

The intent of foregoing arrangements is to allow the selection of a cell bit line and a reference bit line by an activated folded sense amplifier while simultaneously having an intervening middle bit line coupled to the associated open sense amplifier. Say, for example, it was desired to access the cell on bit line 54 located at its intersection with word line 68. Appropriate signals would be fed to column decoder 17, resulting in the activation of the bit switches 16 of amplifier 11. Additional signals would be fed to multiplexing circuitry 46 in order to cause connectors 11A and 11B to couple their "L" bit lines 54 and 56. It will be observed that bit line 54 is a cell bit line and bit line 56 is a reference bit line with respect to word line 68. At the same time, signals would be fed to the multiplexing circuitry 50 resulting in the coupling of connector 5A to bit line 55. Bit line 55 is the middle line lying between bit lines 54 and 56 and is a cell bit line.

An important consideration in the preferred embodiment is the feature of three-way multiplexing of the sense amplifier connections to the array bit lines. For any selected array word line, three conditions arise from the three different selectable states 'L', 'C', and 'R'.

For example referring to FIG. 2, assume that word line 64 is the word line being selected to obtain access to the memory cells:

State 1: Folded sense amplifier 11 is connected through connector 11A to bit line 56 which connects to the cell located at A, shown in outline form, and through connector 11B to reference bit line 58, and open sense amplifier 5 is connected through connector 5A to bit line 57 which connects to the cell located at B, shown in outline form.

State 2: Folded sense amplifier 11 is connected through connector 11B to bit line 57 which connects to the cell located at B, and through connector IIA to reference bit line 55, and open sense amplifier 5 is connected through connector 5A to bit line 56 which connects to the cell located at A.

State 3: Folded sense amplifier 11 is connected through connector 11A to bit line 54 which is connected to the cell located at C and connector 11B is connected to bit line 56 which is connected to the cell located at A, and the open sense amplifier 5 is connected through connector 5A to reference bit line 55.

Obviously, the condition described in State 3 is invalid since it would prevent the normal operation of the array. However, the significant point is that two valid switching states, as noted above, always exists for any selected word line; one which connects Cell A to the folded sense amplifier, and the other which connects Cell B to the folded sense amplifier. Therefore, only the folded sense amplifier bank requires connections to a column decoder, since the open sense amplifiers can always be switched into a state where it is used only for restoring cell data. This configuration results in a saving of space because fewer decoders are required. Additionally, more uniform data input/output is achieved since only folded sense amplifiers are involved in this operation.

It should be understood in the forgoing example that an electrical charge can be sent to or read from the storage cell located at the intersection of bit line 54 and word line 68 via the described connections and data lines 78. Bit line 54 serves as the access line and bit 56 serves as the reference line. Note that bit line 55 contains a storage cell which is turned on by word line 68, thus making bit line 55 a cell bit line. It is a key feature of this invention to steer one cell bit line and one reference bit line into a folded sense amplifier and the intervening cell bit line into an open sense amplifier. Because the middle bit line 55 is between a cell bit line and a reference bit line, the open sense amplifier 5 has total line to line noise cancellation. The other side of the open bit sense amplifier is connected to a reference bit line in array 62. Of course, no word lines are activated in array 62 during an input/output operation in array 61. Thus, lines on either side of the reference bit lines in array 62 are normally connected to the bit line DC equalized level, thus providing total line to line noise shielding with respect to the side of the open sense amplifier 5 coupled to a bit line in array 62. As a result of these arrangements, the open sense amplifier achieves the lowest bit line coupling noise possible.

The folded sense amplifier achieves half of the total possible line to line noise cancellation. Partial noise cancellation occurs because the cell bit line and the reference bit line pair are both coupled to the same open bit line. (I.E. the middle bit line)

Another attractive feature of this architecture is that other types of open bit line noises, such as from voltage transients in word lines or array wells, are greatly reduced. This is because the open sense amplifier bit line on the selected array side sees common mode noise cancellation from the operating folded sense amplifier (i.e. ⅔'s of bit line are noise-free). The opposite array side used only for the open sense amplifier reference is very quiet because only ⅓ of the bit lines are moving. The other ⅔'s of the bit lines are held to AC ground.

It should be understood that all of the amplifiers are turned on during an input/output operation (although the bit switches 16 are activated for only one of them). Also, multiplexing circuitry 46 and 50 causes the connectors of all of the amplifiers to be operated in the same manner, i.e. all connectors are coupled to a left bit line, a center bit line or a right bit line. Since these operations result in accessing all of the cells on the activated word line, all of those cells need to be restored at the end of the input/output operation. Restoration is accomplished in the cells connected to the bit lines accessed by the folded sense amplifiers and in the cells connected to the bit lines accessed by the open sense amplifiers. The restoration step is well known to those skilled in the art.

A further advantage of the above described preferred embodiment is that all of the memory cells can be accessed by the folded bit line sense amplifiers for input/output operations. Thus, there is no need for data lines 78 to be connected to the open bit sense amplifiers. Hence no differences arise in read/write operations as might occur if the open sense amplifier were involved in data transmission.

Figure 3:
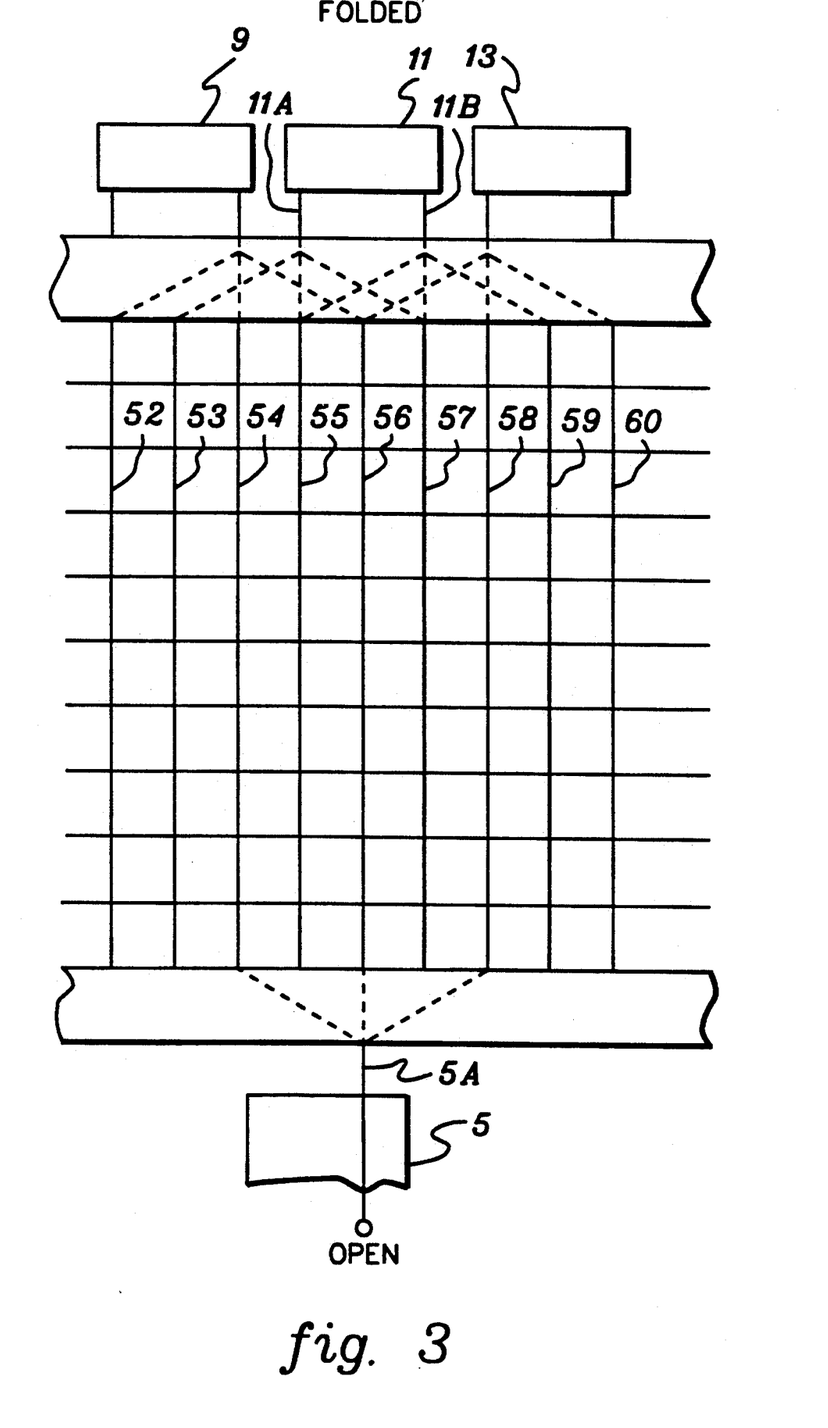
FIG. 3 is a schematic diagram showing a modified version of the preferred embodiment of this invention.

FIG. 3 shows a modified way of multiplexing the connectors of the amplifiers to the bit lines. It differs from the wiring layout of FIG. 2 in that the connectors of each amplifier are multiplexed to every other bit line instead of adjacent bit lines. For example, connector 11A is multiplexed to bit lines 53, 55, and 57 while connector 11B is multiplexed to bit lines 55, 57, and 59. Finally, connector 5A of open sense amplifier 5 is multiplexed to bit lines 54, 56, and 58. It will be seen that when all of the connectors are coupled to their left positions, the desired pattern occurs in which the amplifiers access bit lines 53, 54 and 55 which are a reference line, a cell line and another cell line, respectively, with respect to word line 68 (See FIG. 2). Thus, folded sense amplifier 11 is accessing reference bit line 53 and cell bit line 55, leaving an intervening cell bit line 54 which is accessed by open sense amplifier 5. This arrangement offers an alternative wiring pattern.

Alternatively, a two-way multiplexing arrangement of sense amplifiers to array bit lines is also possible as described below. This embodiment would have the advantage of simpler and denser layout of the multiplexing region. However, the disadvantage, as explained in detail below, is that the provision must be made for column decoder connections to all array bit lines, since any given array cell cannot be guaranteed exclusive connection to a folded sense amplifier.

Figure 4:
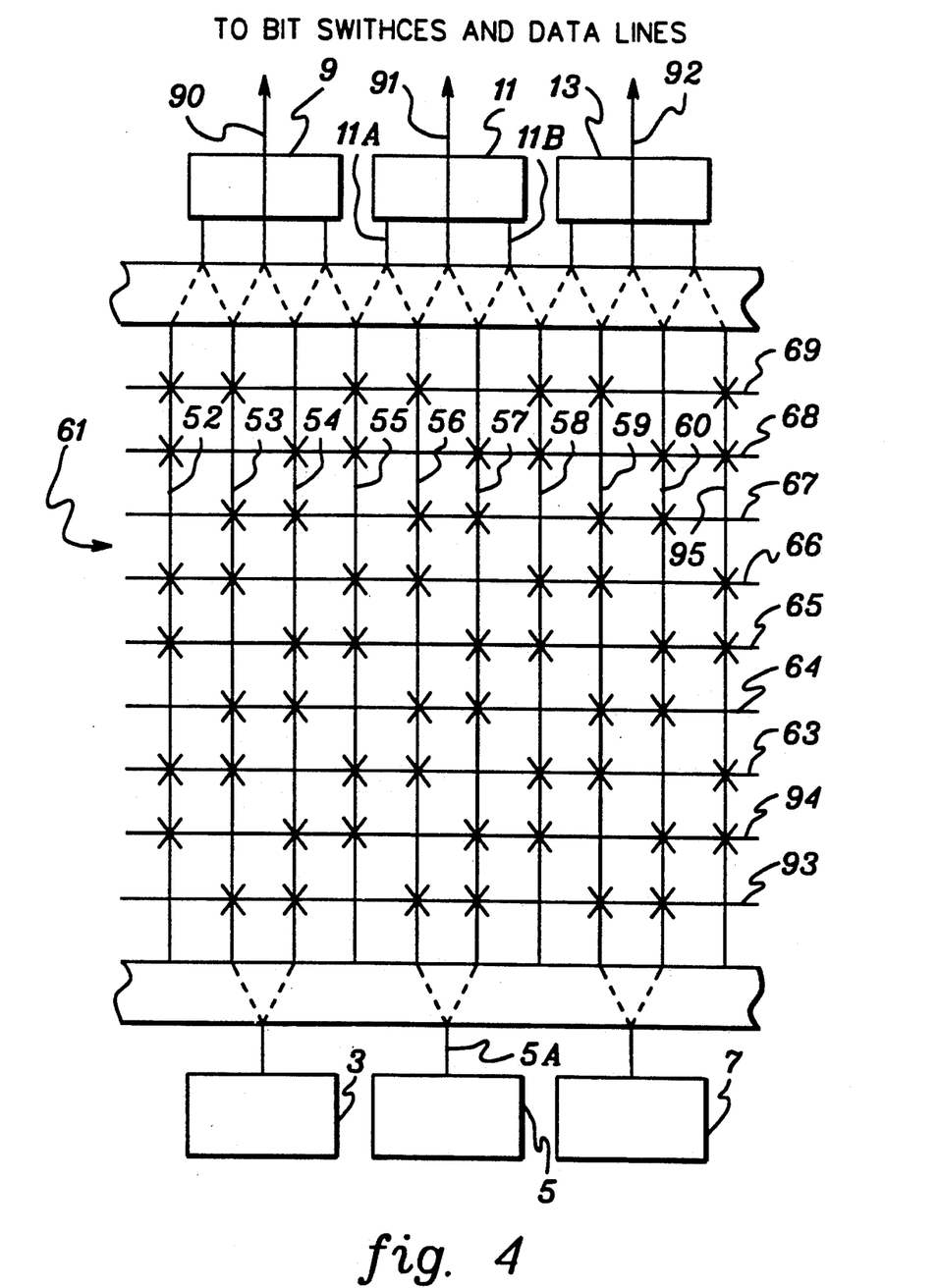
FIG. 4 is a schematic diagram showing an alternate embodiment of the invention.

FIG. 4 shows an alternate embodiment of the invention in which the sense amplifiers are multiplexed to only two bit lines. Array 61 of FIG. 1 is shown with an additional bit line 95. It will be observed, for example, that connector 11A is multiplexed to bit lines 55 and 56, while connector 11B is multiplexed to bit lines lines 57 and 58. Note that connectors 11A and 11B are not multiplexed to a common bit line, as was the case with the preferred embodiment shown in FIG. 2. Note also that connector 5A of sense amplifier 5 is multiplexed to bit lines 56 and 57, line 56 being common with connector 11A and line 57 being common with connector 11B. Once again it will be observed that when the multiplexers are set to their left positions or their right positions, the desired pattern of connector couplings to bit lines occurs. One consequence of this embodiment is that it becomes necessary to add additional multiplexing circuitry as shown for lines 90. 91 and 92. The purpose for the additional multiplexing is to provide a connection between the bit lines accessed by the open sense amplifiers to the data lines of the memory device. This is necessary because in certain instances in using this embodiment of the invention, a targeted memory cell can be accessed only by way of a bit line accessed by an open sense amplifier. For example, if it is desired to perform an operation on the cell located at the intersection of bit line 56 and word line 69, connectors 11A, 11B, and 5A would be set to their left positions. The desired pattern of cell bit line, cell bit line, reference bit line occurs. However, the targeted cell is on line 56 which is being accessed through the open sense amplifier 5. Line 91 provides the necessary path for data transfer, assuming the multiplexer for it is also set to the left position.

While the invention has been particularly shown and described with reference to preferred embodiments thereof, it will be understood by those skilled in the art that various changes may be made in form and details without departing from the spirit and scope of the invention. It is intended to encompass all such changes within the scope of the following claims.

We claim:

1. A compact and relatively noise free memory device comprising:
   a first array comprised of a plurality of memory cells interconnected by a plurality of bit lines and word lines and laid out so that accessible cells are located at two out of every three bit lines encountered along each word line.
   a first set of latches, each having at least two connectors, each connector being multiplexed to a predetermined number of the plurality of bit lines; and
   a second set of latches, each having a first connector multiplexed to a predetermined number of the plurality of bit lines,
   the connectors of the first set of latches and the second set of latches being so arranged with respect to the plurality of bit lines that, for any given word line, the connectors of at least one of the latches of the first set can be coupled to a cell bit line and a non-adjacent reference bit line, leaving an intervening cell bit line, while the first connector of at least one of the latches of the second set can be coupled to the intervening cell bit line.

2. The apparatus of claim 1, wherein each latch of the second set of latches has a second connector, the apparatus further comprising a second array of memory cells interconnected by a plurality of bit lines and word lines wherein the second connector of each latch of the second set of latches is multiplexed to a plurality of bit lines in the second array so that it can be coupled to a reference bit line therein while the first connector is coupled to a cell bit line in the first array.

3. The apparatus of claim 1, wherein the connectors are all multiplexed to three bit lines.

4. The apparatus of claim 3 wherein the bit lines to which the connectors are multiplexed are adjacent to each other.

5. The apparatus of claim 4 wherein the connectors of each latch of the first set can be coupled to one common bit line and the first connector of at least one of the latches of the second set can be coupled to the same common bit line as well as a bit line on either side thereof.

6. The apparatus of claim 5 wherein the cell layout of the first memory array is in half passing word line form.

7. The apparatus of claim 6 further comprising means connected to the latches of the first set for inputting or outputting data to and from the memory device.

8. The apparatus of claim 7 wherein the bit lines are parallel to each other and word lines are perpendicular to the bit lines.

9. The apparatus of claim 3 wherein bit lines to which each connector is multiplexed are not adjacent to each other.

10. The apparatus of claim 1 wherein the connectors are all multiplexed to two bit lines.

11. The apparatus of claim 10 wherein the bit lines to which the connectors are multiplexed are adjacent to each other.

12. The apparatus of claim 11 wherein each latch of the first set is paired with one of the latches of the second set and wherein the connectors of a latch of the first set are not multiplexed to any common bit lines but a connector of its paired latch of the second set is multiplexed to a bit line common to each connector of the latch of the first set.

13. The apparatus of claim 12 wherein the cells of at least the first array are laid out in half passing word line form.

14. The apparatus of claim 13 wherein the bit lines of at least the first array are parallel and the word lines therein are perpendicular to the bit lines.

15. A compact and relatively noise free memory device comprising:
   a first memory array and a second memory array each comprised of a plurality of memory cells interconnected by a plurality of bit lines and word lines and laid out so that accessible cells are located in a repetitive pattern along each bit line and word line;
   a first set of folded sense amplifiers associated with the first memory array and a second set of folded sense amplifiers associated with the second memory array, each folded sense amplifier having two connectors, each connector of the first set being multiplexed to a predetermined number of bit lines of the first memory array and each connector of the second set being multiplexed to a predetermined number of bit lines in the second memory array;
   a set of open sense amplifiers each having a first connector multiplexed to a predetermined number of bit lines in the first memory array and a second connector multiplexed to a predetermined number of bit lines in the second memory array;
   the connectors of the first and second set of folded sense amplifiers and the set of open sense amplifiers eing so multiplexed with respect to the bit lines that, for any given word line, the connectors of at least one of the associated set of folded sense amplifiers can be coupled to a cell bit line and a non-adjacent reference bit line, leaving an intervening cell bit line while the first connector of at least one of the open sense amplifiers can be coupled to the intervening cell bit line.

16. The apparatus of claim 15 wherein the repetitive pattern in which the cells are laid out is such that accessible cells are located at two out of every three bit lines encountered along a word line.

17. The apparatus of Claim 16 wherein the connectors are all multiplexed to three bit lines.

18. The apparatus of claim 17 wherein the bit lines to which the connectors are multiplexed are adjacent to each other.

19. The apparatus of claim 18 wherein the connectors of each folded sense amplifier can be coupled to one common bit line and the first connector of at least one open sense amplifier can be coupled to the same common bit line, as well as a bit line on either side thereof.

20. The apparatus of claim 19 wherein the cell layout of the first memory array is in half passing word line form.

21. The apparatus of claim 20 further comprising means connected to the folded bit sense amplifier for inputting or outputting data to and from the memory device.

22. The apparatus of claim 21 wherein the bit lines are parallel to each other and word lines are perpendicular to the bit lines.

23. The apparatus of claim 16 wherein the bit lines to which the connectors are multiplexed are not adjacent to each other.

24. The apparatus of claim 16 wherein the connectors are multiplexed to two bit lines.

25. The apparatus of claim 24 wherein the bit lines to which each connector is multiplexed are adjacent to each other.

26. The apparatus of claim 25 wherein each folded sense amplifier is paired with one of the open sense amplifiers and wherein the connectors of a folded sense amplifier are not multiplexed to any common bit lines but a connector of its paired open sense amplifier is multiplexed to a bit line common to each connector of the folded sense amplifier.

27. The apparatus of claim 26 wherein the cells of the first memory array and the second memory array are laid out in halt passing word line form.

28. The apparatus of claim 27 wherein the bit lines of the first memory array and the second memory array are parallel and the word lines therein are perpendicular to bit lines.

29. A method for performing a relatively noise free data input/output operation on a memory device having an array of memory cells laid out so that accessible cells are located in a repetitive pattern along each bit line and word line comprising the steps of:
   activating a word line for accessing a targeted cell;
   coupling a folded bit line sense amplifier to a reference bit line and a cell bit line leaving an unselected intervening cell bit line;
   coupling one connector of an open sense amplifier to the intervening cell bit line and capacitively balancing the open sense amplifier through its other connector; and
   conducting the data input/output through one of the sense amplifiers.

30. The method of claim 29 wherein said step of conducting the data operation is carried out through said folded bit line sense amplifier.

* * * * *

UNITED STATES PATENT AND TRADEMARK OFFICE
CERTIFICATE OF CORRECTION

PATENT NO. : 5,276,641
DATED      : January 4, 1994
INVENTOR(S): Edmund J. Sprogis and Hing Wong It is certified that error appears in the above-indentified patent and that said Letters Patent is hereby corrected as shown below:

Abstract, line 18, change "lines" to "line"
Abstract, line 18, after "the" and before "accessed" insert: --bit lines--
Abstract, line 19, omit "line"
Abstract, line 21, omit "bit"
Col. 2, line 24, change "or" to "of"
Col. 10, claim 14, line 55, change "eing" to "being"

Signed and Sealed this

Fourteenth Day of June, 1994

BRUCE LEHMAN

Attest:

Attesting Officer

Commissioner of Patents and Trademarks